United States Patent
Chen (10) Patent No.: US 7,362,581 B2
(45) Date of Patent: Apr. 22, 2008

(54) HEAT SINK FIXING DEVICE

(75) Inventor: Win-Haw Chen, Taipei (CN)

(73) Assignee: Inventec Corporation (TW)

( * ) Notice: Subject to any disclaimer, the term of this patent is extended or adjusted under 35 U.S.C. 154(b) by 55 days.

(21) Appl. No.: 11/394,973

(22) Filed: Mar. 30, 2006

(65) Prior Publication Data
US 2007/0127214 A1 Jun. 7, 2007

(30) Foreign Application Priority Data
Dec. 5, 2005 (TW) .............................. 94221089 U (51) Int. Cl.
*H05K 7/20* (2006.01)

(52) U.S. Cl. .................. 361/709; 361/704; 361/719; 165/80.3; 165/104.33; 165/185; 439/331

(58) Field of Classification Search ........ 361/702–712, 361/714, 715, 719, 720, 726–728, 736–737, 361/749, 760, 764; 165/80.2, 80.3, 80.4, 165/165, 185; 257/706–727; 248/316.1, 248/316.7, 505, 510, 457, 458; 439/331, 439/342, 485; 24/453, 457, 458
See application file for complete search history.

(56) References Cited

U.S. PATENT DOCUMENTS 4,063,791 A * 12/1977 Cutchaw ..................... 439/331
4,433,886 A * 2/1984 Cassarly et al. ............... 439/65
6,280,222 B1 * 8/2001 Walkup ....................... 439/331
6,704,195 B2 * 3/2004 Cravens et al. ............. 361/687
6,735,085 B2 * 5/2004 McHugh et al. ............ 361/719
6,898,083 B1 * 5/2005 Hornung .................... 361/704
6,952,348 B2 * 10/2005 Wu ............................. 361/719
6,987,672 B2 * 1/2006 Franz et al. ................ 361/704
7,035,107 B2 * 4/2006 Eckblad et al. ............. 361/719
2005/0108877 A1 * 5/2005 Peterson .................. 29/890.03

FOREIGN PATENT DOCUMENTS

| TW | 483657 | 11/1984 |
| TW | 456586 | 6/1989 |
| TW | 564010 | 4/1990 |

* cited by examiner

*Primary Examiner*—Michael Datskovskiy
(74) *Attorney, Agent, or Firm*—Peter F. Corless; Steven M. Jensen; Edwards Angell Palmer & Dodge LLP (57) ABSTRACT

A heat sink fixing device has an enclosing frame socket having a central part for disposing a heat generating unit of an electronic device thereon, with a heat sink mounted on the enclosing frame socket and covering the heat generating unit. A first fixing part is provided on a bottom surface of the heat sink, and a second fixing part corresponding to the first fixing part of the heat sink is provided on the enclosing frame socket, allowing the heat sink to be coupled to the frame socket by coupling the first fixing part of the heat sink with the second fixing part of the frame socket, thereby substantially maximizing heat dissipating area on the heat sink.

9 Claims, 6 Drawing Sheets

HEAT SINK FIXING DEVICE

FIELD OF THE INVENTION

The present invention relates to heat sink fixing techniques, and more particular, to a heat sink fixing device.

BACKGROUND OF THE INVENTION

A Central Processing Unit (CPU) is responsible for operations and controls of a computer, therefore plays a primary role in the operation of a computer. However, a CPU generates a significant amount of heat when it operates at high frequencies and speeds, and high temperature may become a potential crisis to cause a computer system crashing, therefore, a heat dissipating device is invented for solving the problems.

Figure 1:
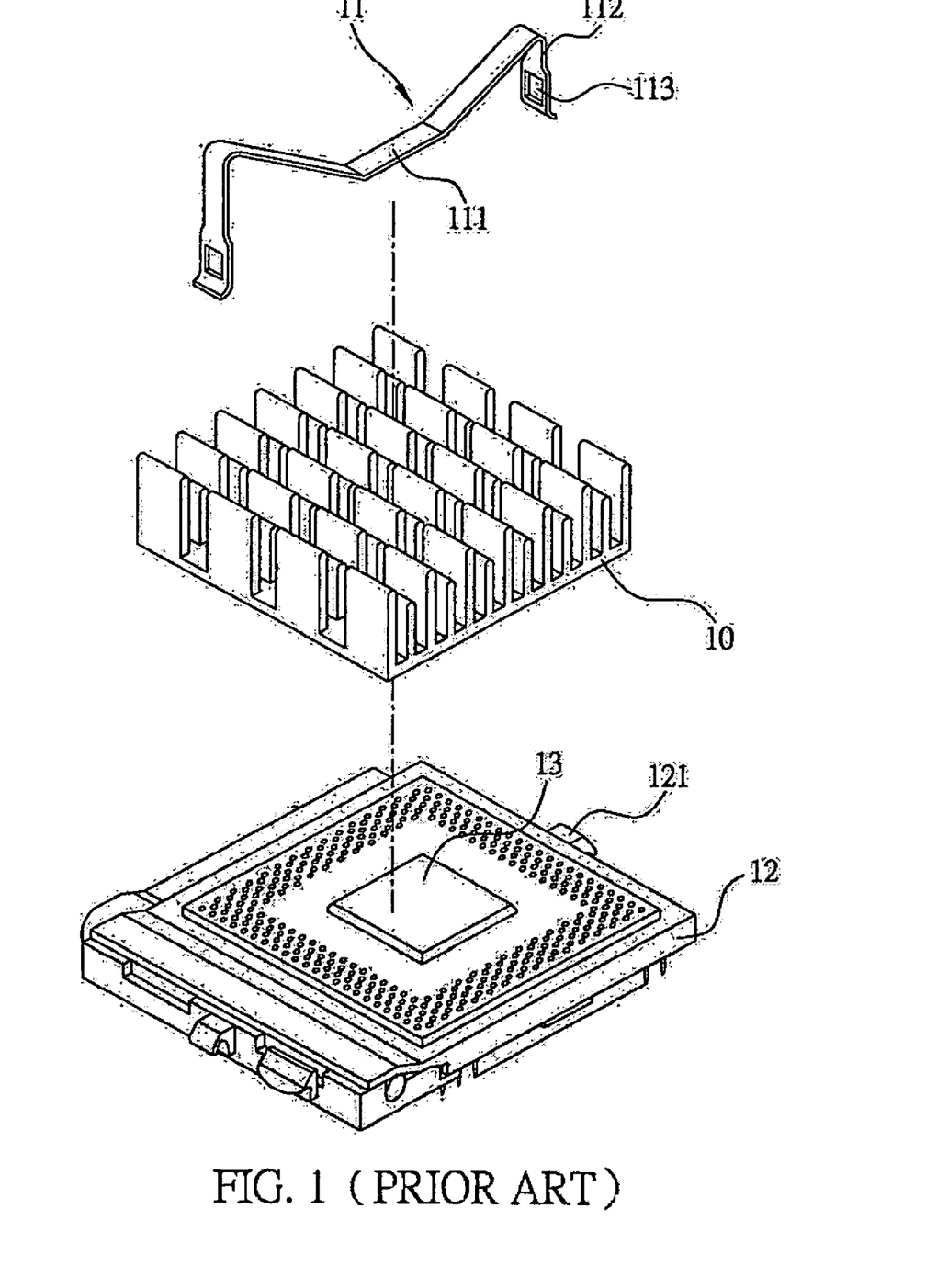
FIG. 1 (PRIOR ART) 1 is a schematic diagram showing a heat dissipating device of Taiwan Patent No. 456586.

FIG. 1 shows a conventional heat dissipating device for dissipating heat from the CPU that is disclosed in Taiwan Patent No. 456586, comprising a CPU socket 12, a heat sink 10 and a fastener 11. A CPU 13 is mounted on the CPU socket 12 while the heat sink 10 is overlaid on the topside of the CPU 13. The heat sink 10 is fixed by the fastener 11 on the CPU socket 12. The fastener 11 has a retaining part 111 pressing downwards. Both ends of the retaining part 111 diagonally extend away and upwards from the centre of the retaining part 111 and then bend downward forming fastening parts 112 thereof. A hole 113 is formed around the end of each of the fastening parts 112, which couples to a respective one of a pair of ears 121 on the lateral sides of the CPU socket 12, so as to mount the heat sink 10 on the CPU socket 12.

However, during the process of assembling and dissembling the fastener 11, certain tools are needed to fasten or unfasten the holes 113 of the fastener 11 to/from the ears 121 of the CPU socket 12, therefore it is extremely inconvenient to use, especially during assembling or servicing, which is one of the major drawbacks affecting the efficiency of operation. In order to solve the drawbacks of using the conventional fastener 11, a technique of using an elastic strip to fix a heat sink has been developed, as shown in Taiwan Patent No. 483657 and 564010.

Figure 2:
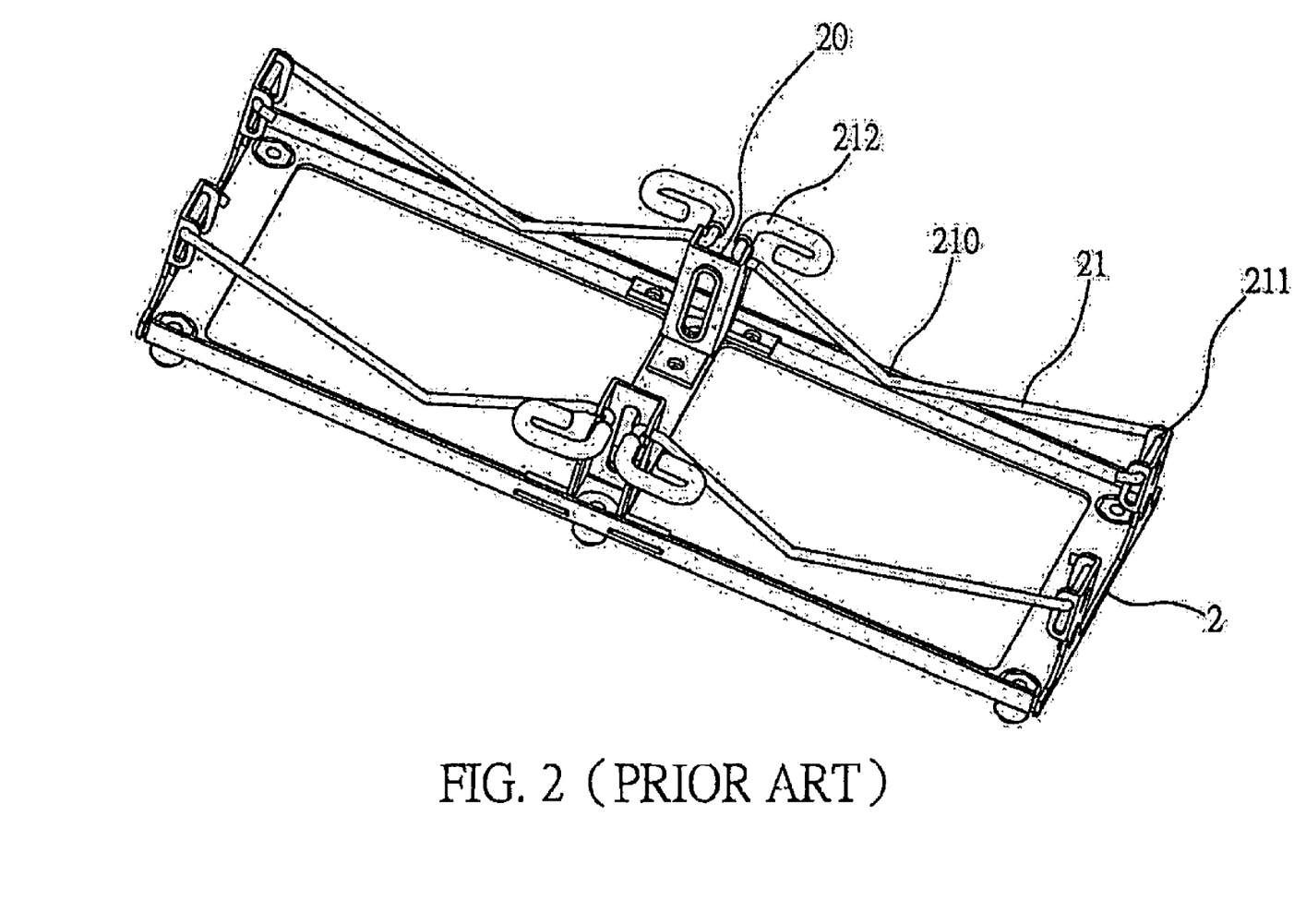
FIG. 2 (PRIOR ART) is a schematic diagram showing a heat sink fixed by elastic strips of the prior art.

Referring to FIG. 2, an elastic strip 21 has a retaining part 210, a pivot 211 pivotally coupled to a fixing frame 2 and a fastening part 212. As shown in the drawing, the elastic strip 21 is a symmetric structure used to fix a heat sink in position by means of hooking the fastening part 212 of the elastic strip 21 in a corresponding fastening hole 20 of the fixing frame 2 through the pivot 211, such that the retaining part 210 presses downwardly on the heat sink positioned on the fixing frame 2, causing the heat sink (not shown in the drawing) to make contact with the CPU.

However, although using the above-mentioned elastic strip 21 to fix a heat sink solves the problems of inconvenience in assembly and disassembly and uneven stress on the heat sink, the fastening structure still occupies a majority of space of the heat sink. As a result, resistance of airflow increases, thereby undesirably affecting efficiency of heat dissipation. Furthermore, the elastic strip 21 needs to be operated individually, as shown in FIG. 2, wherein at least four fastening or unfastening operations are required in order to completely fasten or unfasten all the elastic strips 21 to/from the respective fastening holes 20.

Therefore, how to overcome the drawbacks in the prior art is an issue urgently requiring a solution.

SUMMARY OF THE INVENTION

In the view of the drawbacks abovementioned, a primary objective of the present invention is to provide a heat sink fixing device for reducing undesirable influence of the heat sink fixing device on the heat-dissipating airflow of a heat sink.

Another objective of the present invention is to provide a heat sink fixing device for allowing a heat sink to be easily assembled and disassembled to/from a fixing frame.

Still another objective of the present invention is to provide a heat sink fixing device for allowing a heat sink to be firmly fixed on a fixing frame.

In order to achieve the foregoing and other objectives, the heat sink fixing structure proposed by the present invention comprises an enclosing frame socket having a central part for disposing a heat generating unit thereon, with a heat sink being mounted on the enclosing frame socket and covering the heat generating unit; a first fixing part provided on a bottom surface of the heat sink; and a second fixing part provided on the enclosing frame socket and corresponding to the first fixing part, allowing the first fixing part of the heat sink to be coupled to the second fixing part of the frame socket so as to connect the heat sink to the enclosing frame socket, thereby substantially maximizing heat dissipating area on the heat sink.

Two suspending arms and two first fastening parts are respectively formed on two opposing sides of the enclosing frame socket. One end of each of the suspending arms is pivotally coupled to the frame socket and linked to one of fixing members while the other end of each of the suspending arms has a second fastening part corresponding to the respective one of the first fastening parts, so that when second fastening part of each of the suspending arms is fastened to the corresponding first fastening part, the fixing members linked to the suspending arms are actuated, causing the first fixing part of the heat sink to be firmly coupled to the second fixing part of the frame socket. An operating arm for coupling the two second fastening parts is provided so as to allow the suspending arms on both sides of the frame socket to function simultaneously.

Preferably, the second fastening part is a hook pivotally mounted on the suspending arm, while the first fastening part is a protruding pillar. The first fixing part comprises at least a pillar having a slot on the circumference thereof, and the second fixing part comprises at least an opening overlapping a third fixing part of the fixing member. The third fixing part comprises a first opening and a second opening for receiving the first fixing part. An elastic arciform sliding track is provided laterally along two sides of the second opening for sliding into the slot of the first fixing part and abutting against the first fixing part, such that the heat sink is firmly fixed on the frame socket.

The frame socket has a plurality of guiding slots that respectively corresponding to one of a plurality of sliding protrusions on each of the fixing members. At least one of the sliding protrusions is further coupled with a linkage element between the blocking part and the frame socket, the linkage element further coupling to one of the suspending arms.

In order to fix the heat sink on the frame socket, first the first fixing part of the heat sink is disposed such that it penetrates the second fixing part of the frame socket to be received in the first opening of the fixing member. Then, the suspending arms are pressed down, and the fixing member slides from the first opening to the second opening of the fixing member via the actuation of the linkage element, such that now the first fixing part is received and fixed in the second opening. More specifically, the slot of the first fixing part of the heat sink is abutted against the elastic arciform sliding track along the second opening. Accordingly, the heat sink is firmly fixed on the frame socket.

In comparison with the prior art in which a fixing structure directly presses onto the heat sink, the heat sink fixing device proposed by the present invention has the fixing structure formed from an enclosing frame socket, providing a substantially maximum surface area of the heat sink to be exposed and in contact with the airflow so as to achieve the optimal heat dissipating efficiency.

Furthermore, the heat sink fixing technique of the prior art requires more complicated steps and/or larger force to fix the heat sink in place, thus the heat sink often suffers from uneven stress which also lead to damages of the electronic component (e.g. CPU) in contact with the heat sink. The heat sink fixing device of the present invention, however, provides a simple operation method to fix the heat sink in place by pressing the suspending arm downwardly, so that the second fastening part is fastened with the first fastening part. Moreover with the aid of operating arm, the heat sink can be fixed in place in a simple method.

In summary, the heat sink fixing device of the present invention is, among other advantages, easy to assemble and operate as well as having substantially maximum heat-dissipating efficiency and firm fixing, thereby having high values in the industry.

DETAILED DESCRIPTION OF THE PREFERRED EMBODIMENTS

The present invention is described in the following with specific embodiments, so that one skilled in the pertinent art can easily understand other advantages and effects of the present invention from the disclosure of the invention. The present invention may also be implemented and applied according to other embodiments, and the details may be modified based on different views and applications without departing from the spirit of the invention. In addition, the drawing and the components shown herein are not to scale and are made in simplicity with provision of only associated components related to the invention; in practical usage, the component may be more complexly structured and the number, size, shape and arrangement of each component can be varied accordingly.

Figure 3:
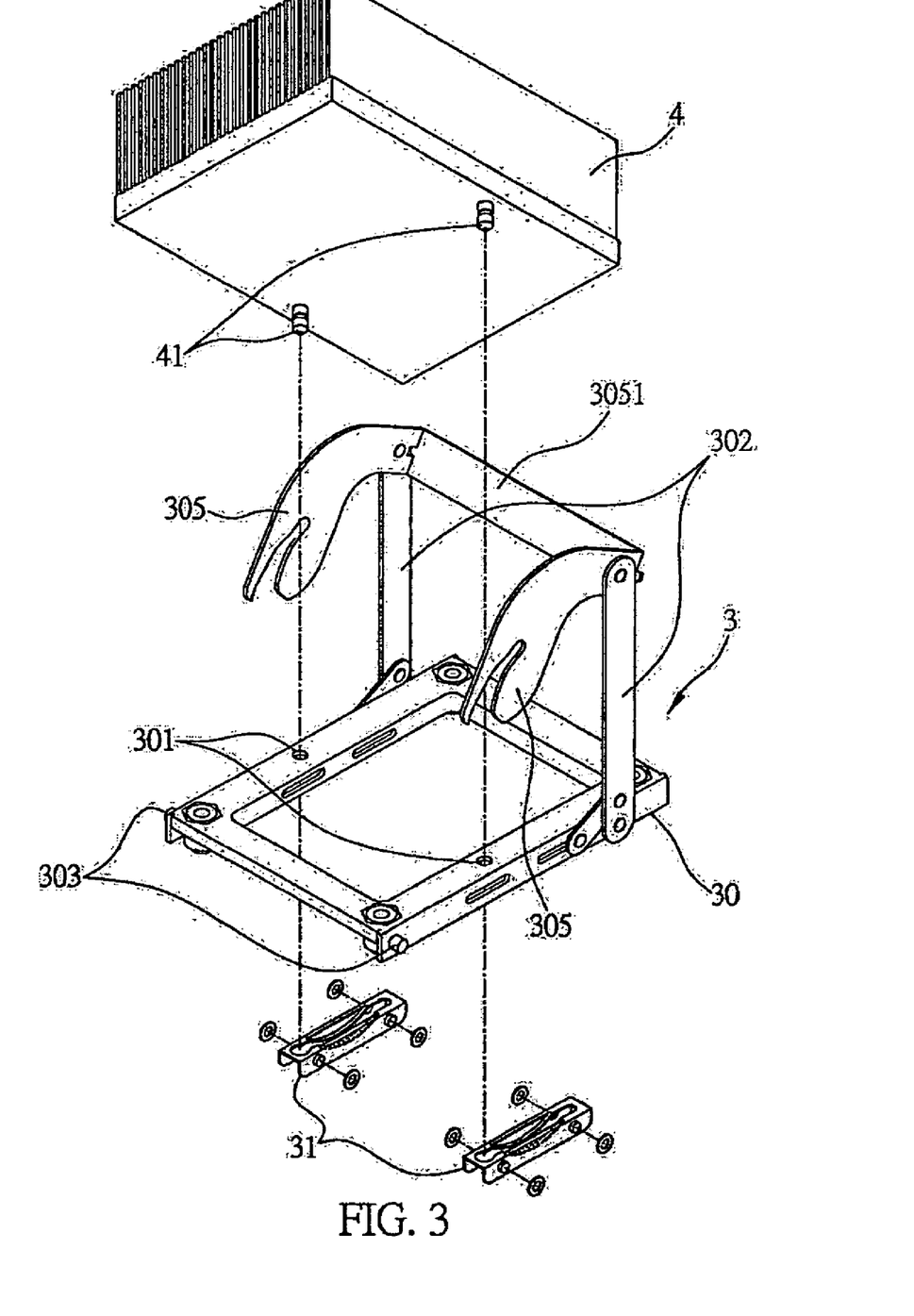
FIG. 3 is a schematic diagram showing a first preferred embodiment of the heat sink fixing device of the present invention.

FIG. 3 is a schematic diagram showing a first preferred embodiment of a heat sink fixing device of the present invention. The heat sink fixing device 3 comprises an enclosing frame socket 30 for disposing a heat generating unit of an electronic device (not shown) at its central area and allowing a heat sink 4 to be coupled to the enclosing frame socket 30 in such a way that the heat generating unit is covered. A first fixing part 41 is provided on the bottom of the heat sink 4 and a corresponding second fixing part 301 is provided on the frame socket 30, allowing the heat sink 4 to be physically coupled to the frame socket 30 by means of coupling the first fixing part 41 of the heat sink 4 with the second fixing part 301 of the frame socket 30, so as to minimize obstructed heat dissipating area of the heat sink 4.

Two suspending arms 302 and two first fastening parts 303 are respectively formed on each opposing side of the enclosing frame socket 30; one end of each suspending arm 302 is pivotally coupled to the frame socket 30 as well as linked to a fixing member 31 (described in more details below) while the other end of each suspending arm 302 has a second fastening part 305 opposite to the first fastening part 303 of the frame socket 30, so as to fix the first fixing part 41 of the heat sink 4 to the second fixing part 301 of the frame socket 30 in place.

The second fastening part 305 is a hook pivotally mounted on the suspending arm 302 while the first fastening part 303 is a protruding pillar. An operating arm 302 is provided between the two suspending arms 302 for coupling the two second fastening parts 305 on the opposite sides of the frame socket 30 together, so as to allow the suspending arms 302 on the two sides of the frame socket 30 to function simultaneously.

Figure 4A:
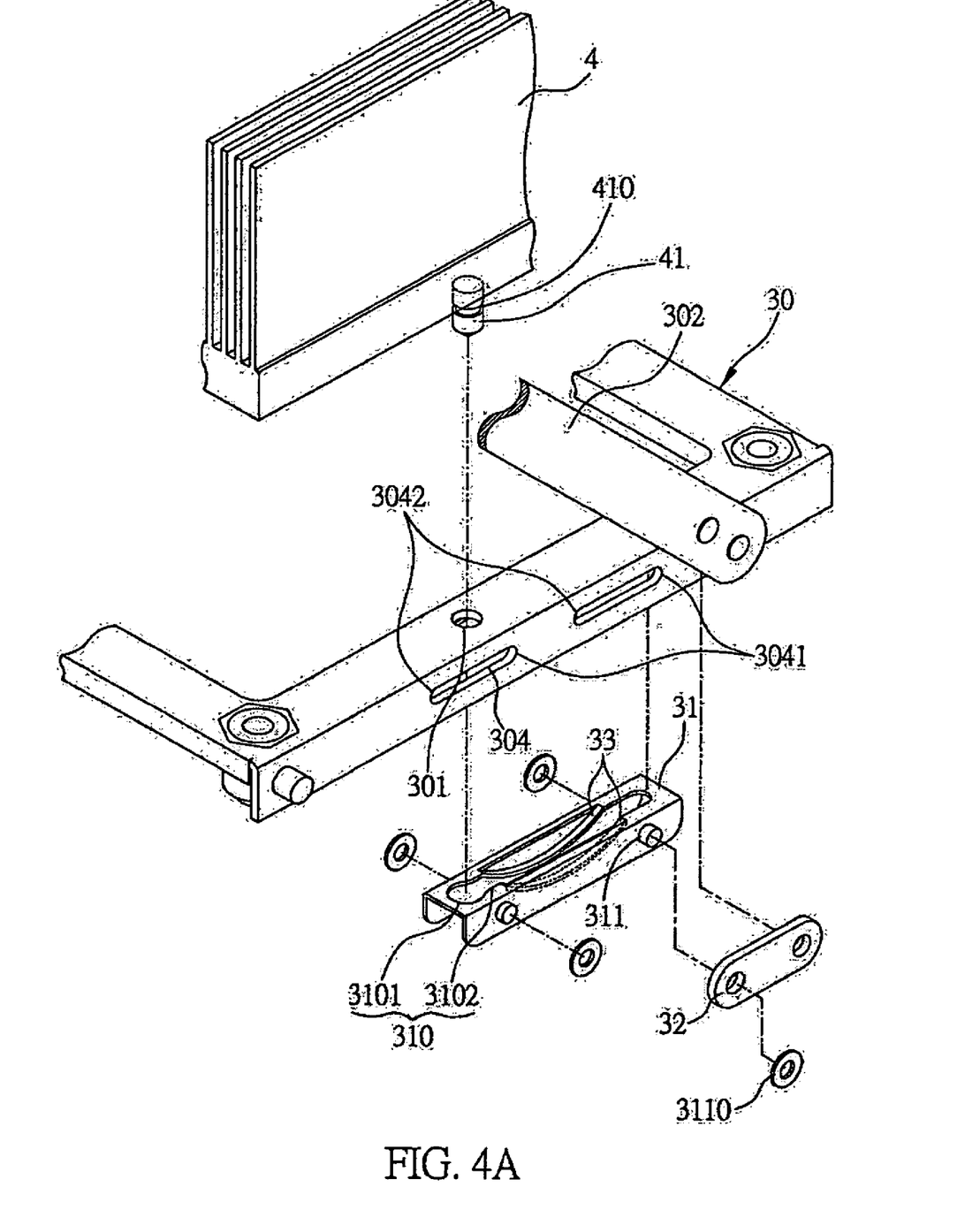
FIG. 4A is a partial exploding view showing the heat sink fixing device of the present invention in more details.
Figure 4B:
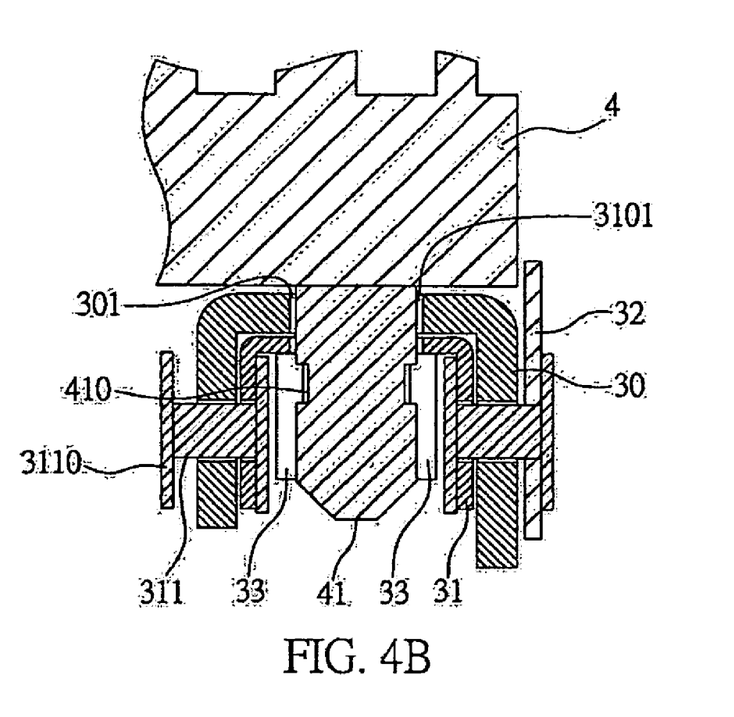
FIGS. 4B and 4C are cross-sectional views showing the heat sink fixing device of the present invention illustrating a first fixing part of a heat sink positioned in the first opening and the second opening of a fixing member, respectively.
Figure 4C:
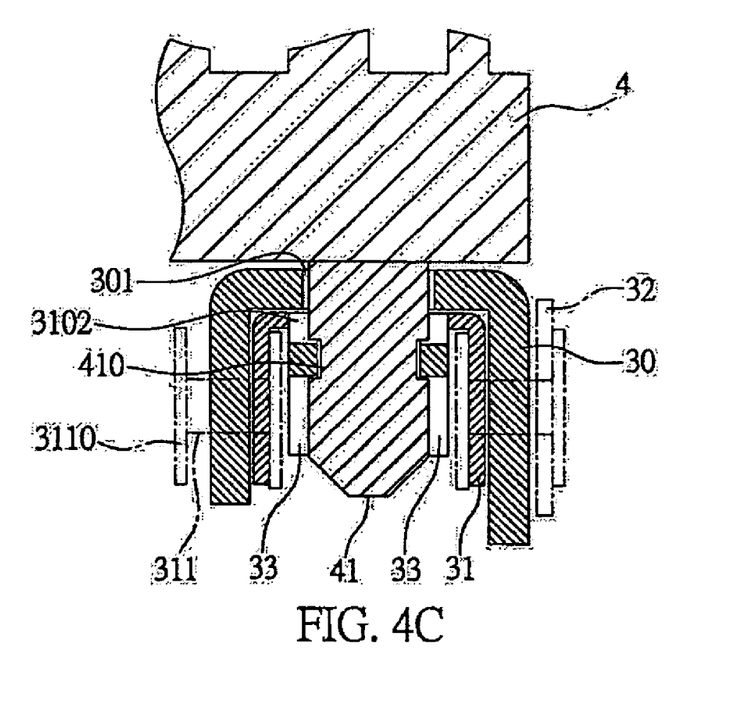

FIGS. 4A to 4C show portions of the heat sink fixing device of FIG. 3 in more details, wherein FIG. 4A is an partial exploding diagram showing one side of the frame socket 30 and FIGS. 4B and 4C are cross-sectional perspective views showing the fixing member 31 mounted on the frame socket 30. It should be noted that in the exemplary preferred embodiments various parts are respectively provided on both sides of the heat sink fixing structure, but in order to avoid repeated illustrations, FIGS. 4A to 4C only depict one side of the structure.

Referring to FIG. 4A, the first fixing part 41 of the heat sink 4 is a pillar having a slot 410 surrounding the circumference of the pillar while the corresponding second fixing part 301 of the frame socket 30 is an opening. The fixing member 31 has a third fixing part 310 overlapping the second fixing part 301. The third fixing part 310 is constituted by a first opening 3101 and a second opening 3102 for receiving the first fixing part 41. Elastic arciform sliding tracks 33 are formed respectively on the two opposing sides of the second opening 3102, so that the tracks 33 can be slid into the slot 410 of the first fixing part 41 of the heat sink 4.

Referring to FIG. 4A in conjunction to FIGS. 4B and 4C, the frame socket 30 has plurality of guiding slots 304. The fixing member 31 has sliding protrusions 311 and the number of which is the same as that of the guiding slots allowing the fixing member 31 to move along the guiding slots 304 within the frame socket 30. A blocking part 3110 is coupled to each of the sliding protrusions 311 in order to fix the fixing member 31 on the frame socket 30 without coming off. One of the sliding protrusions 311 is pivotally coupled with a linkage element 32 between the blocking part 3110 and the frame socket 30, so as to link the fixing member 31 with the suspending arm 302.

The fixing member 31 is movable within the region defined between a first end 3041 and a second end 3042 of the guiding slots 304. When the sliding protrusions 311 are at the first ends 3041, as shown in FIG. 4B, the fixing member 31 overlaps the second fixing part 301 via the first opening 3101, meanwhile the first fixing part 41 is positioned as penetrating through the second fixing part 301 and the first opening 3101 of the fixing member 31. When the sliding protrusions 311 are moved to the second ends 3042, as shown in FIG. 4C, the fixing member 31 overlaps the second fixing part 301 via the second opening 3102, causing the elastic arciform sliding tracks 33 to slide into the sliding slot 410 of the first fixing part 41 penetrating through the second fixing part 301, so that the first fixing part 41 can be tightly abutted, that is, the heat sink 4 can now be tightly fixed to the frame socket 30.

Figure 5A:
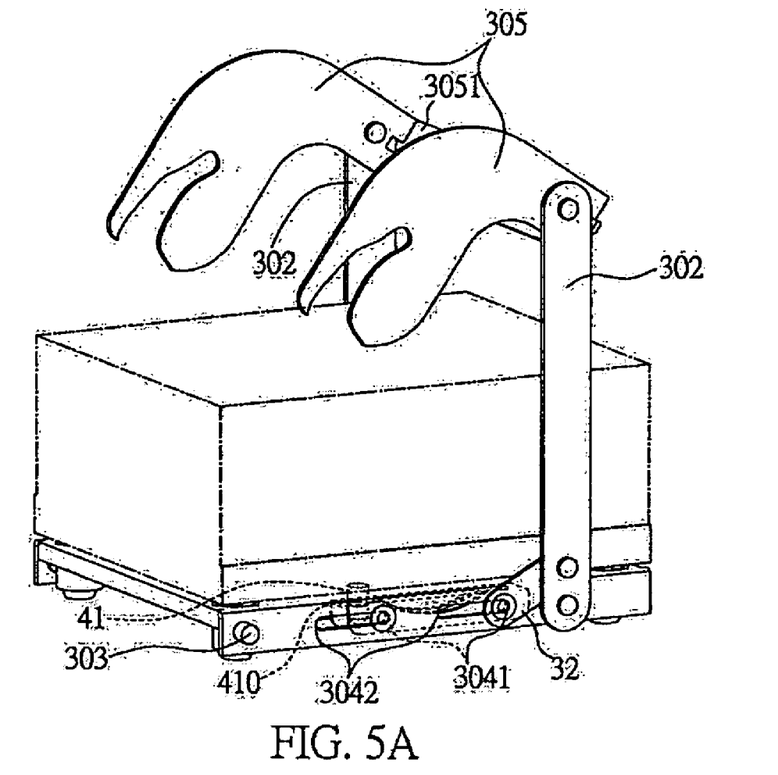
FIGS. 5A and 5B are side views depicting a heat sink before and after assembling to the heat sink fixing device of the of the present invention.
Figure 5B:
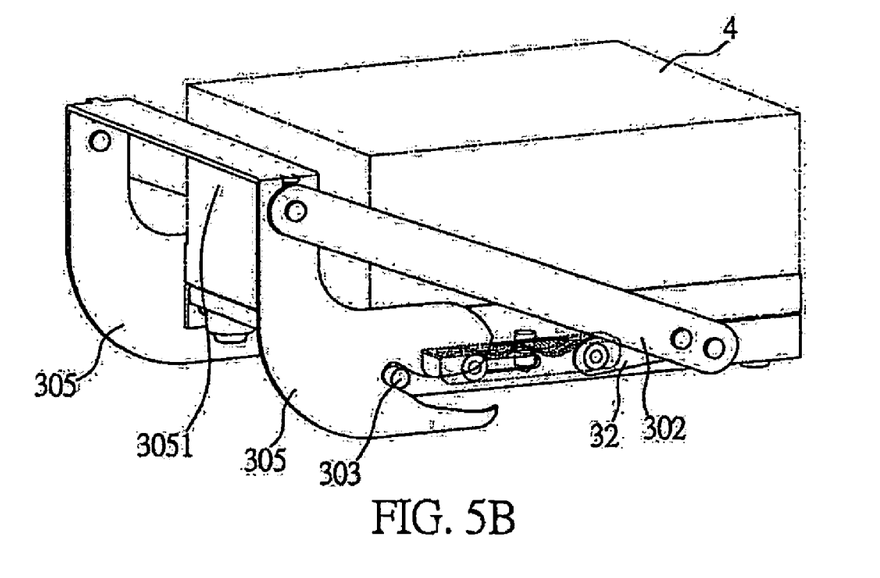

The heat sink fixing device before and after the process of fastening are shown in FIGS. 5A and 5B, respectively.

Referring to FIG. 5A, the second fastening part 305 is unfastened with the first fastening part 303, and the sliding protrusions 311 are located at the first ends 3041. As mentioned above, at this time the first fixing part 41 of the heat sink 4 is positioned in the first opening 3101 of the fixing member 31 via the second fixing part 301.

Pulling the suspending arm 302 down via the operating arm 3051 causes the linkage element 32 to be pushed, and in turn the sliding protrusions 311 to be pushed from the first end 3041 toward the second end 3042. Originally, the fixing member 31 is coupled to the second fixing part 301 via its first opening 3101, however through the action of pushing down the suspending arms and the movement of the sliding protrusions 311 towards the second end 3042, the elastic arciform sliding track 33 slides into the slot 410 of the first fixing part 41, such that the first fixing part 41 is firmly fixed in position.

Referring to FIG. 5B, when the sliding protrusion 311 moves to the second end 3042 and the second fastening part 305 is fastened with the first fastening part 303, the arciform sliding track 33 exerts a significant amount of elastic force to the slot 410 so as to tightly clamp the heat sink in place. Therefore, the heat sink will not come off the frame socket easily unless being unfastened. The heat sink fixing device passes the dropping test. Moreover, substantially maximum surface area of the heat sink 4 is exposed to the air without being blocked by any objects, and as a result, heat dissipating efficiency is maximized.

In order to unfasten the heat sink fixing device, the operating arm 3051 is actuated on to release the second fastening part 305 from the first fastening part 303. Upon releasing, the elastic force exerted by the arciform sliding track 33 is also released and as the arciform sliding track 33 is relatively smooth, the sliding protrusions 311 is easily moved to the first end 3041 of the guiding slot 304 experiencing less elastic force. This allows a user to easily flip the second fasting part 305 from the first fastening part 303 under this elastic force effect.

In summary, when the second fastening part 305 is released from the corresponding first fastening part 303, the sliding protrusions 311 are at the first end 3041 of the guiding slot 304 and the first fixing part 41 is coupled to the first opening 3101; when the second fastening part 305 is fastened to the corresponding first fastening part 303, the sliding protrusions 311 are at the second end 3041 of the guiding slot 304 and the first fixing part 41 is coupled to the second opening 3102 to allow the arciform sliding track 33 to exert elastic force on the first fixing part 41 in the slot 410.

In comparison with the prior art in which a fixing structure directly presses onto the heat sink, the heat sink fixing device proposed by the present invention has the fixing structure formed from an enclosing frame socket, providing a substantially maximum surface area of the heat sink to be exposed and in contact with the airflow so as to achieve the optimal heat dissipating efficiency.

Moreover, the heat sink fixing device of the invention eliminates the complicated steps with the use of tools in the prior art and requires only a simple action of pushing down the suspending arms via the operating arm of the heat sink fixing device to fix the heat sink in place, as well as preventing uneven force and damages of the electronic devices below.

Moreover, as the bottom surface of the heat sink has a pillar-like first fixing part, which is coupled to the opening-like second fixing part on the frame socket, the heat sink can be quickly and accurately mounted on the frame socket in the right orientation, so as to avoid misplacement.

In conclusion, the heat sink fixing device of the present invention solves the various conventional drawbacks, and has high value in the industry The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

The invention claimed is:

1. A heat sink fixing device, comprising:
an enclosing frame socket having a central part for disposing a heat generating unit thereon, with a heat sink being mounted on the enclosing frame socket and covering the heat generating unit;
a first fixing part provided on a bottom surface of the heat sink; and
a second fixing part provided on the enclosing frame socket and corresponding to the first fixing part, allowing the first fixing part of the heat sink to be coupled to the second fixing part of the frame socket so as to connect the heat sink to the enclosing frame socket, thereby substantially maximizing heat dissipating area on the heat sink,
wherein two suspending arms and two first fastening parts are respectively formed on two opposing sides of the enclosing frame socket, wherein one end of each of the suspending arms is pivotally coupled to the enclosing frame socket and linked to a fixing member, and the other end of each of the suspending arms has a second fastening part corresponding to the respective one of the first fastening parts, so that when the second fastening part of each of the suspending arms is fastened to the corresponding one of the first fastening parts, the fixing members linked to the suspending arms are actuated, causing the first fixing part of the heat sink to be firmly coupled to the second fixing part of the enclosing frame socket.

2. The heat sink fixing device of claim 1, wherein the second fastening part of each of the suspending arms is a hook pivotally mounted on its corresponding suspending arm, and each of the first fastening parts is a protruding pillar.

3. The heat sink fixing device of claim 1, further comprising an operating arm for coupling the two second fastening parts to each other so as to allow the suspending arms on the two sides of the enclosing frame socket to function simultaneously.

4. The heat sink fixing device of claim 1, wherein the enclosing frame socket further has a plurality of guiding slots that respectively correspond to a plurality of sliding protrusions on the fixing members, and a blocking part is mounted at a rear end of at least one of the sliding protrusions so as to allow the fixing member to be fixed to the enclosing frame socket and move within a range defined by the guiding slots.

5. The heat sink fixing device of claim 4, wherein the at least one of the sliding protrusions is further coupled with a linkage element between the blocking part and the enclosing frame socket, and the linkage element is further coupled to one of the suspending arms.

6. The heat sink fixing device of claim 1, wherein the first fixing part comprises at least a pillar having a slot on a circumference thereof, the second fixing part comprises at least an opening, and the fixing member comprises a third fixing part communicating with the second fixing part.

7. The heat sink fixing device of claim 6, wherein the third fixing part comprises a first opening and a second opening for receiving the first fixing part.

8. The heat sink fixing device of claim 7, wherein an elastic arciform sliding track is respectively provided laterally along two sides of the second opening, for sliding into the slot of the first fixing part and abutting against the first fixing part.

9. The heat sink fixing device of claim 8, wherein as the second fastening part is unfastened from the first fastening part, the sliding protrusions are at one end of the guiding slots and the first fixing part is received in the first opening, and as the second fastening part is fastened with the first fastening part, the sliding protrusions are pushed towards the other end of the guiding slots and the elastic arciform sliding track is slid into the slot of the first fixing part and abuts against the first fixing part.

* * * * *